US006113247A

United States Patent [19]

Adams et al.

[11] Patent Number: 6,113,247

[45] Date of Patent: Sep. 5, 2000

[54] REFLECTOR FOR AUTOMOTIVE EXTERIOR LIGHTING

[75] Inventors: Edward R. Adams, Spring Lake; Philip O. Wakeling, Norton Shores; John F. Adams, Holland, all of Mich.

[73] Assignee: Lorin Industries, Inc., Muskegon, Mich.

[21] Appl. No.: 09/451,644

[22] Filed: Nov. 30, 1999

Related U.S. Application Data

[63] Continuation of application No. 09/026,924, Feb. 20, 1998.

[51] Int. Cl.[7] .................... F21V 7/02; G02B 5/08; H01L 33/00

[52] U.S. Cl. .................... 362/237; 362/241; 362/247; 362/249; 362/800; 359/855; 257/98

[58] Field of Search .................... 359/838, 850, 359/851, 855, 867, 868, 869, 896; 29/463, 469.5, 609; 72/326; 362/236, 237, 240, 241, 247, 249, 800; 257/88, 98

[56] References Cited

U.S. PATENT DOCUMENTS

| | | |
|---|---|---|
| 2,387,804 | 10/1945 | Miskella . |
| 2,561,022 | 7/1951 | Jones . |
| 3,386,608 | 6/1968 | Diller . |
| 3,469,686 | 9/1969 | Gutsche et al. . |
| 4,245,280 | 1/1981 | Hartman . |
| 4,254,453 | 3/1981 | Mouyard et al. . |
| 4,399,490 | 8/1983 | Broadt . |
| 4,486,364 | 12/1984 | Takahashi . |
| 4,582,447 | 4/1986 | Itoh . |
| 4,742,432 | 5/1988 | Thillays et al. . |
| 5,040,681 | 8/1991 | Grusin . |
| 5,404,282 | 4/1995 | Klinke et al. . |
| 5,410,453 | 4/1995 | Ruskouski . |
| 5,660,461 | 8/1997 | Ignatius et al. . |

*Primary Examiner*—Ricky D. Shafer
*Attorney, Agent, or Firm*—Warner Norcross & Judd LLP

[57] ABSTRACT

A reflector particularly adapted for use in automotive light assemblies and other point light source applications. The reflector includes two nested aluminum discs. Each disc defines a plurality of semi-circular holes and includes a half-cone or other partial revolved surface extending from each hole. The half-cones of the first disc extend through the stamped holes of the second disc. The semi-circular holes on the two discs cooperate to define circular holes, and the half-cones at each circular hole cooperate to form full cones. Preferably, the disks are identical; and the first disc is rotated 180° for nesting with the second disc. When the reflector is incorporated into a light assembly, LEDs or other point light sources are positioned within each full cone, and a lens is mounted over the reflector.

1 Claim, 7 Drawing Sheets

REFLECTOR FOR AUTOMOTIVE EXTERIOR LIGHTING

This is a continuation of application Ser. No. 09/026,924, filed Feb. 20, 1998.

BACKGROUND OF THE INVENTION

The present invention relates to reflectors and, more particularly, to a reflector for use in automotive lighting and other point light source applications.

The automotive industry is increasingly replacing the single light bulb in an exterior light with a plurality of light emitting devices (LEDs) or other point light sources. These point light sources have the advantage of functioning for a longer time than do light bulbs; and, if a single point light source malfunctions, the illumination level of the light assembly is barely affected.

The reflectors for point light source based-light assemblies are different from reflectors for single-bulb assemblies. The point light source reflectors must define a plurality of mini-reflectors—one for each of the point light sources. Usually, each of the mini-reflectors is cone-shaped or has the shape of another revolved surface. Each point light source is mounted near the apex of the mini-reflector, which directs the light away from the reflector. A lens (often colored) optionally covers the reflector to redirect the light.

Known point light source reflectors are injection molded plastic vapor coated with aluminum, a commonly-used, highly reflective material. However, the injection molded reflectors are relatively expensive to produce, involving several production steps and including the vapor coating process. Thus, the reflectors have limited acceptance due to cost constraints.

SUMMARY OF THE INVENTION

The aforementioned problems are overcome by the present invention wherein the point light source reflector includes a pair of nested plates, each providing a portion of each mini-reflector cone or other revolved surface. The nested plates together provide a complete mini-reflector cone for each light source. Preferably, each plate is a metal stamping, such as anodized aluminum or other specular metal or other material. The reflector is less expensive than the prior art reflector, due to the elimination of expensive production steps.

As disclosed, the aluminum plates are stamped such that each plate has a plurality of stamped segments attached to the plate by a joint. Each segment is formed into a half-cone or other partial revolved surface extending away from the plate. The half-cone remains attached to the plate at the joint. Further as disclosed, the arrangement of holes with the half-cones extending therefrom, allows the plates to be identical to one another and to be nested so that the half-cones of one plate interfit with the half cones of the other plate.

More specifically, the first plate is rotated 180° relative to the second plate and is nested with the second plate to form a joined disc. As the two plates are nested, the cone portions of the second plate slip through the semi-circular holes in the first plate and meet the cone portions of the first plate. The cone portions mesh and form full cones extending from the joined plate. Further preferably, the plate assembly is unapertured except for the cones.

These and other objects, advantages, and features of the invention will be more readily understood and appreciated by reference to the detail description of the preferred embodiment and the drawings.

DETAILED DESCRIPTION OF THE PREFERRED EMBODIMENT

Figure 1:
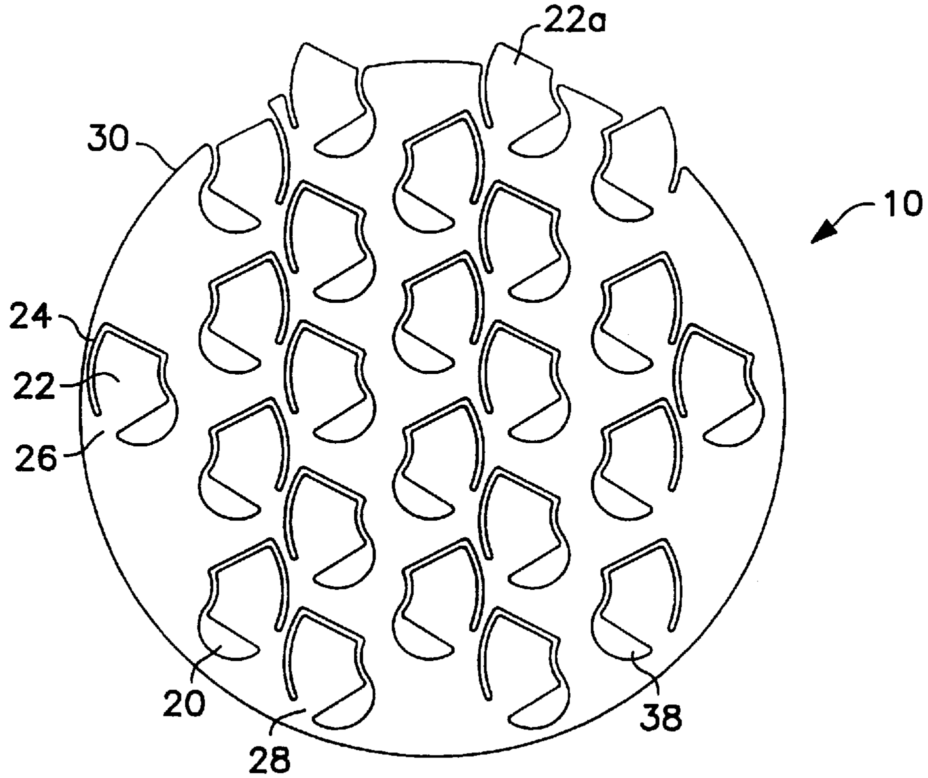
FIG. 1 is a top plan view of the stamped blank from which the reflector disc is formed.

The present invention is described in connection with automotive exterior lighting. However, the invention is equally well suited as a reflector in other LED or point light source applications.

A lighting assembly incorporating the reflector of the present invention is illustrated in the drawings and generally designated 5. The assembly includes a reflector 43, a plurality of LEDs 150 or other point light source, and an optional lens 158. Both the LEDs 150 and the reflector 43 are conventional and well known to those skilled in the art. The novelty of the present invention resides in the reflector 43, which is a sandwich of two identical, nested discs 62. The nested discs 62 provide a plurality of cone-shaped or other revolved surface mini-reflectors 70, each supporting one of the LEDs 150.

I. The Disc

Figure 2:
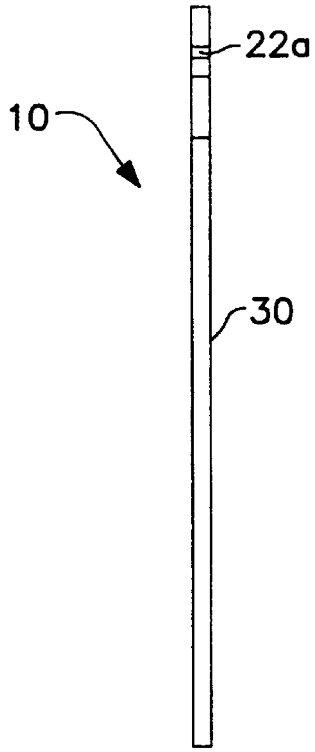
FIG. 2 is a right side elevational view of the stamped blank.

A plate or disc according to a preferred embodiment of this invention is illustrated in FIGS. 1 and 2 and generally designated 10. For the preferred embodiment, the disc is illustrated as a circular shape; however, the concept of the invention is not limited by the shape of the disc. The preferred shape of the disc will depend on the particular application. Preferably the disc is formed of anodized aluminum, which provides the desired reflective and structural properties at a relatively low cost. Any other specular metal or material may be used depending on the particular application.

The aluminum disc 10 is stamped to form a plurality of semi-circular holes 20. In addition, segments 22 of the disc 10 are defined by stamping the perimeter 24 of the segments 22. Each segment 22 is attached to the disc 10 by a joint 26, i.e. a portion 28 of the segment perimeter 24 which is not stamped. The segments 22 may extend beyond the perimeter 30 of the disc 10 due to the layout of the semi-circular holes 20 and segments 22 as seen in segment 22*a*.

Figure 3:
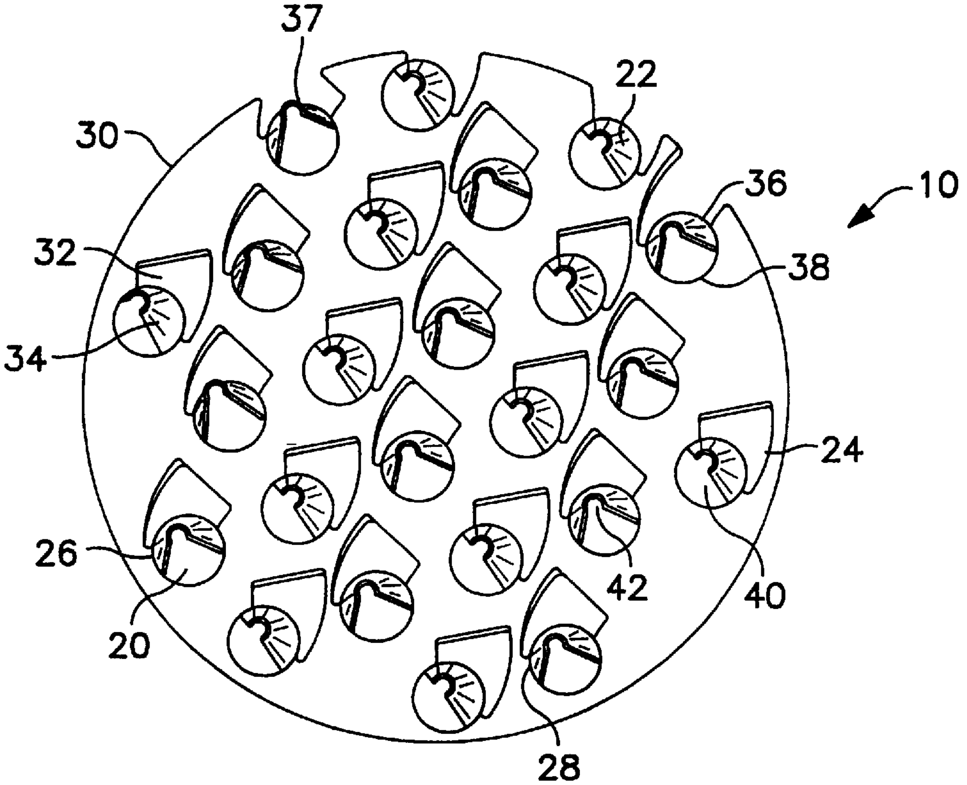
FIG. 3 is a top perspective view of the fully formed reflector disc with the protruding half cones.
Figure 5:
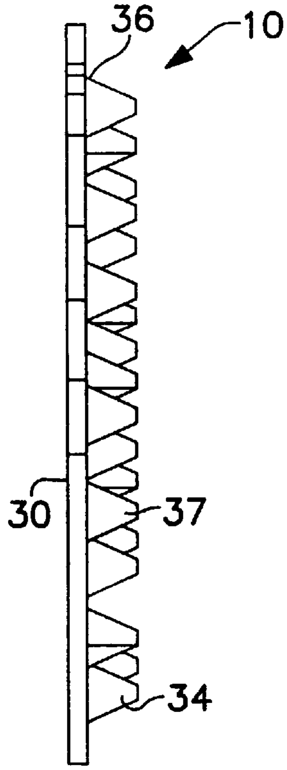
FIG. 5 is a left side elevational view of the fully formed reflector disc with the protruding half cones.
Figure 4:
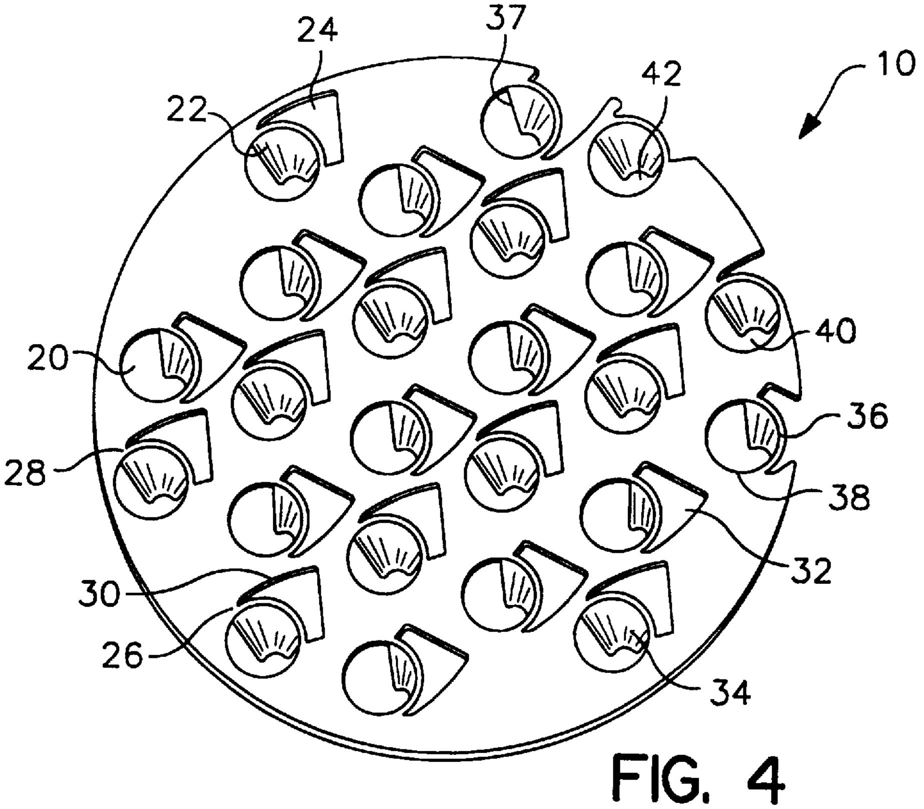
FIG. 4 is a bottom perspective view of the fully formed disc with the protruding half cones.

As seen in FIGS. 3, 4, and 5, each segment 22 is bent at its joint 26 and rolled so that it forms a protrusion lying outside the plane of the disc 10. The removal of the segments 22 from the disc 10 form a plurality of second holes 32 on the disc 10. Each segment 22 is formed into a half (or partial) cone shape 34 or mini-reflector portion, with an open top 42 and an apex 37, and remains attached to the disc 10 at the joint 26. The mini reflector portion is not limited to a half-cone shape. It may have the shape of any partially revolved surface, such as a parabola or ellipse. The perimeter 36 of each half cone 34 meets the perimeter 38 of a semi-circular hole 20, and these perimeters 36 and 38 define a circular hole 40. Of course, the segment 22 may be formed into shapes other than a half-cone, depending on the design of the segment 20.

II. The Reflector

Figure 6:
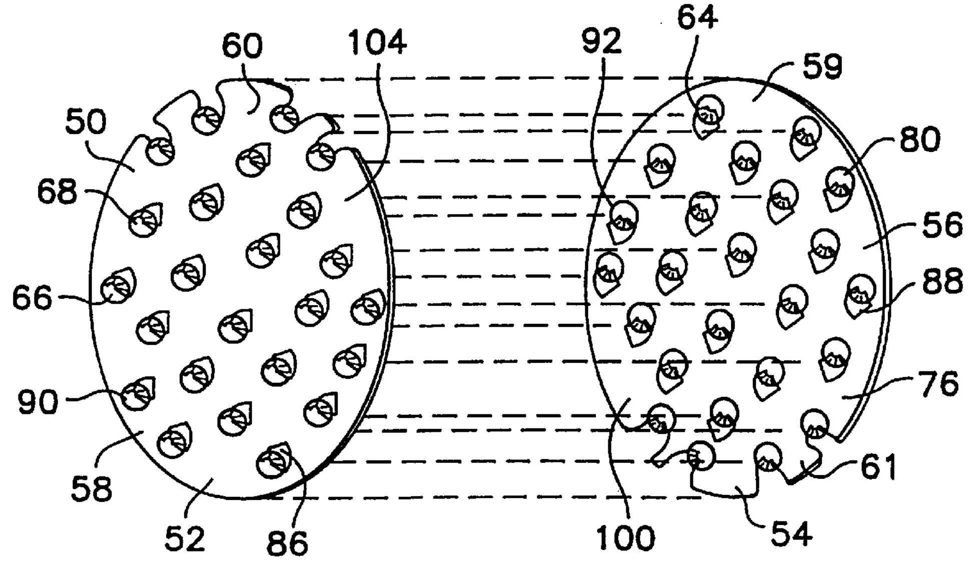
FIG. 6 is an exploded view of two discs forming the reflector assembly.

As seen in FIG. 6, two of these discs 10, each having a front side 77 and 76 and a back side 74 and 75, are nested to form a reflector, generally designated 43. A first disc 50 is rotated 180° so that the top 52 of the first disc 50 meets the bottom 54 of a second disc 56. The stamped design on the top portion 58 and 59 of each disc 50 and 56 is a reversed image of the design on the bottom portion 60 and 61 of each disc 50 and 56. Therefore, when the first disc 50 is rotated 180°, it meshes with the second disc 56, forming a joined disc 62.

Figure 7:
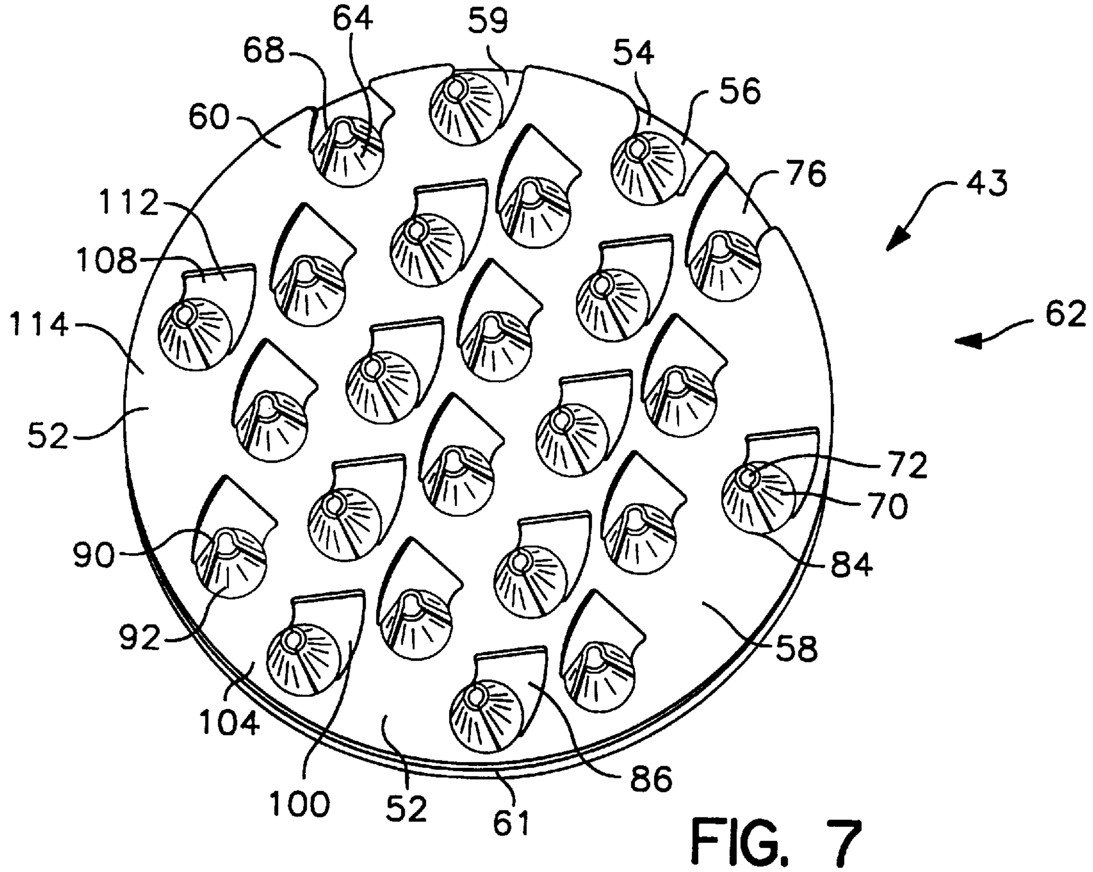
FIG. 7 is a top perspective view of the reflector assembly including the two nested discs.
Figure 9:
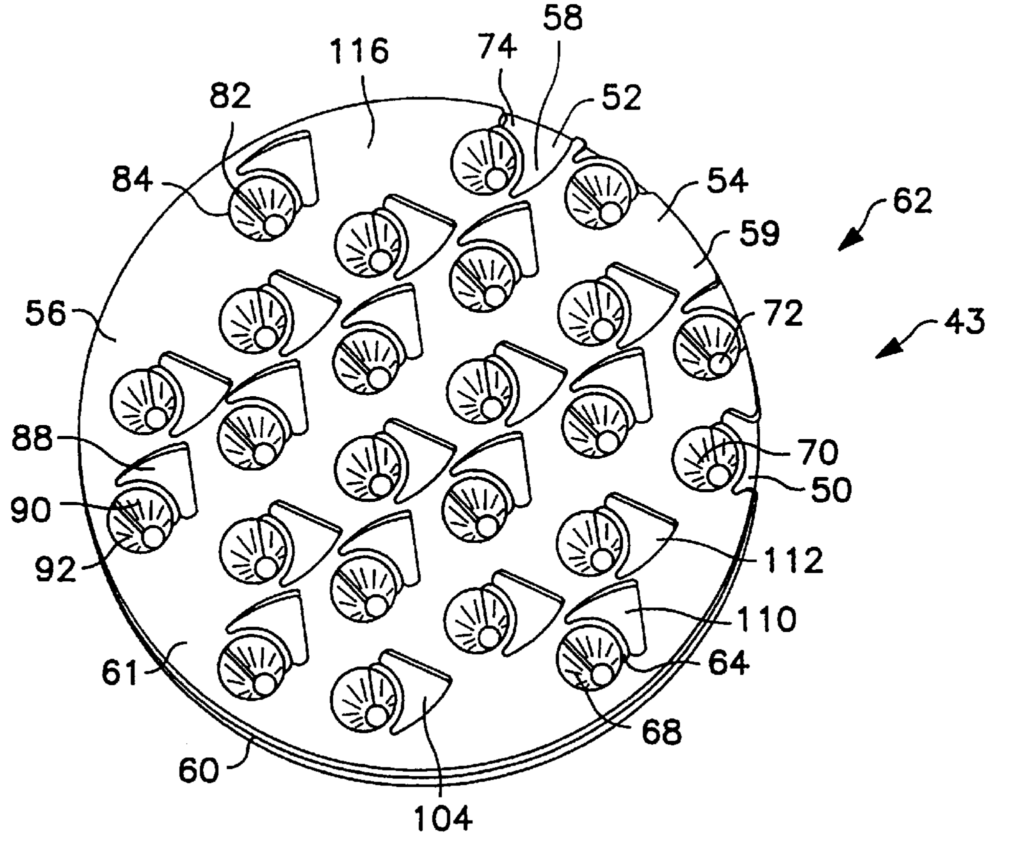
FIG. 9 is a bottom perspective view of the reflector assembly including the two nested discs.
Figure 8:
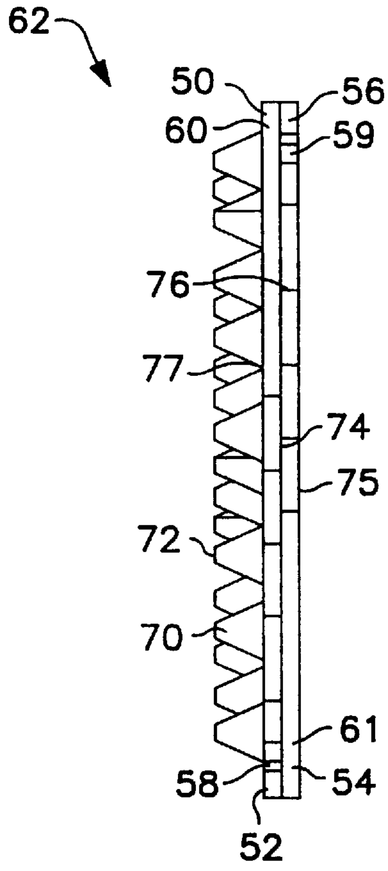
FIG. 8 is a right side elevational view of the reflector assembly including the two nested discs.

As seen in FIGS. 7, 8, and 9, as the discs 50 and 56 are joined, the half cones 64 of the second disc 56 pass through the semi-circular holes 66 of the first disc 50 and mesh with the half cones 68 of the first disc 50; the half cones 64 and 68 form a full cone 70 or mini-reflector having an open top 72. The back side 74 of the first disc 50 meets the front side 76 of the second disc 56. In addition, the semi-circular holes 66 and 80 on the first and second discs 50 and 56 meet and form a circular hole 82 in the joined disc 62. Each circular hole 82 is encircled at its perimeter 84 by a full cone 70.

The second holes 86 and 88 on each disc 50 and 56, formed by the removal of the segments 90 and 92, are not readily apparent on the joined disc 62. As the discs 50 and 56 nest, the second holes 86 on the first disc 50 are met by solid portions 100 of the front side 76 of the second disc 56, and the second holes 88 on the second disc 56 are met by solid portions 104 of the back side 74 of the first disc 50. Thus, the joined disc 62 appears to contain only the circular holes 82 encircled by the full cones 70. However, the areas 108 and 110 on the joined disc 62 which formed the second holes 86 and 88 on the first and second discs 50 and 56 may be identified by examination of the joined disc 62. The joined disc 62 is obviously two nested discs 50 and 56, and even though the second hole areas 108 and 110 are covered, they form distinct regions 112 on the front and back sides 114 and 116 of the joined disc 62.

III. The Light Assembly

Figure 10:
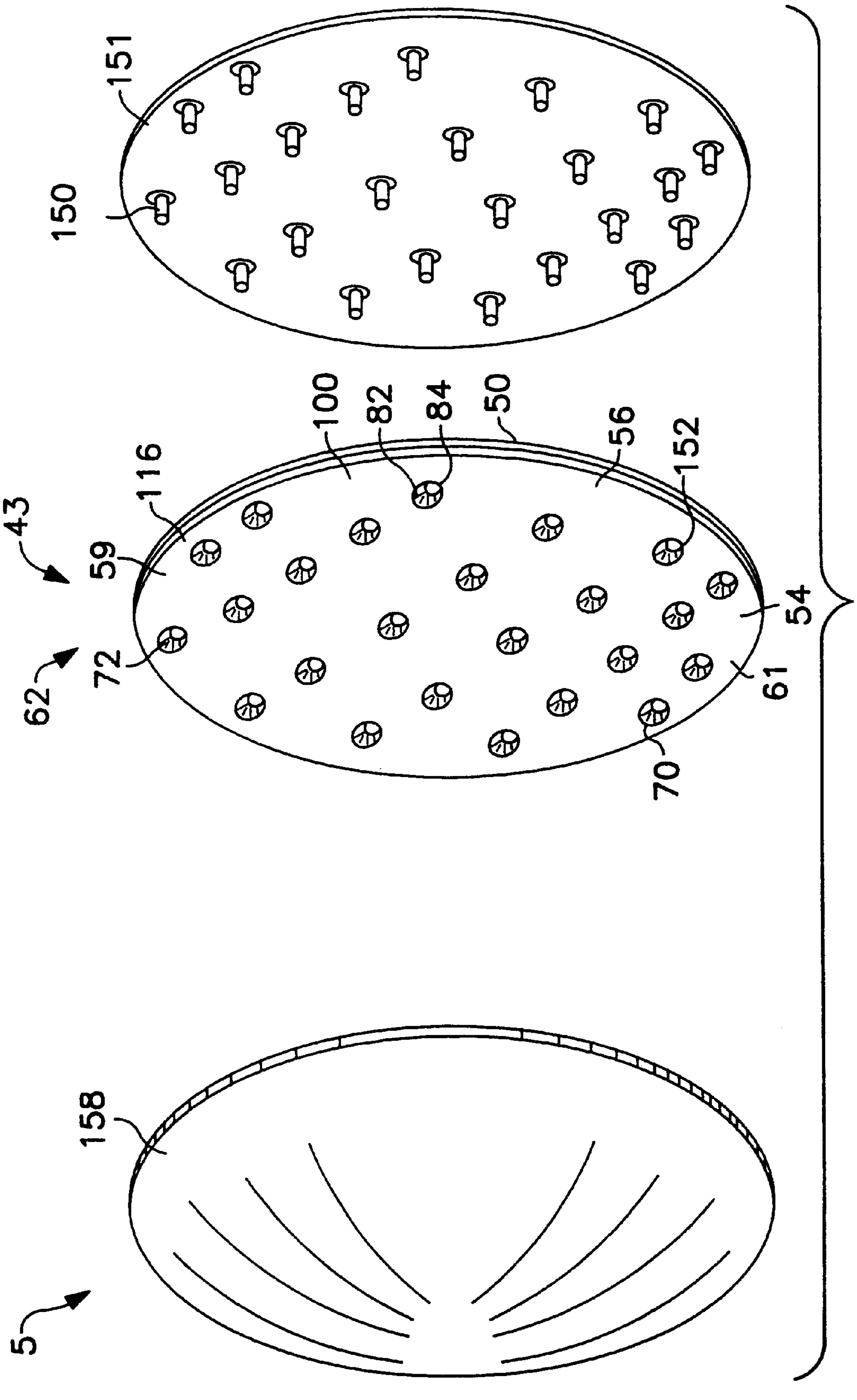
FIG. 10 is an exploded view of a light assembly including the reflector assembly, the LED circuit board and a lens.

As seen in FIG. 10, LEDs 150 or other point light source are mounted on a circuit board 151. The reflector 43 is placed over the circuit board 151 and on top of the LEDs 150. The reflector 43 is positioned such that the LEDs 150 lie within the open top 72 of each cone 70 and are directed towards the open base 152 of the cone 70. As light travels from the LED 150, it is reflected by the cone 70; additionally, the back side 116 of the joined disc 62 reflects the light. A lens 158 optionally covers the joined disc 62 and redirects the light from the plurality of LEDs 150.

IV. Alternative Embodiment

Figure 11:
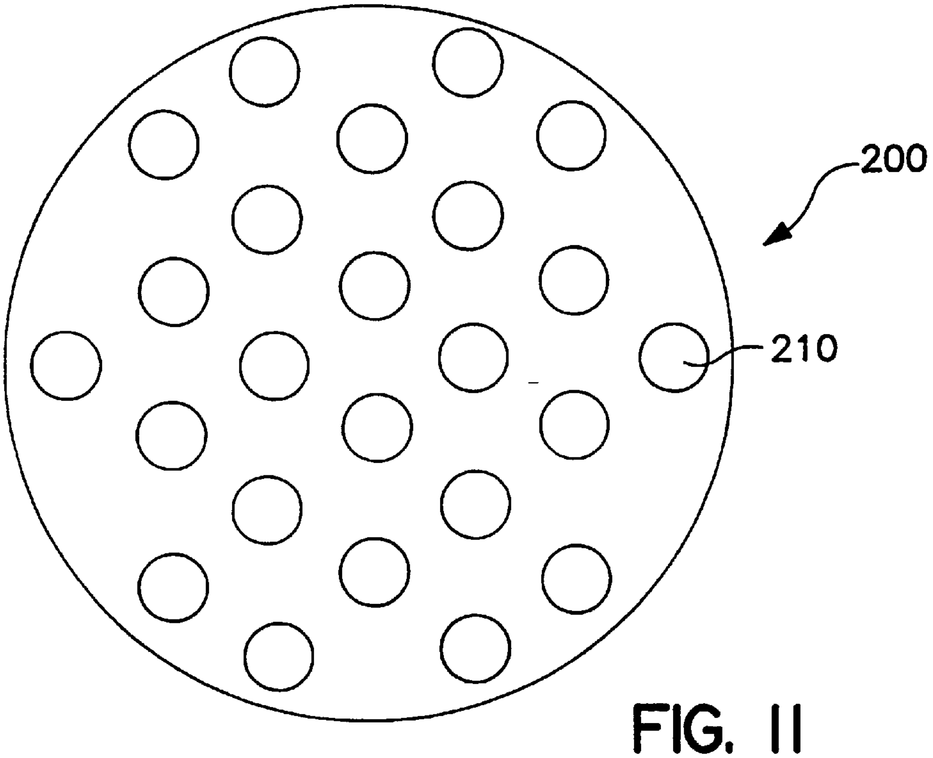
FIG. 11 is a top plan view of the third disc included in the alternative embodiment.
Figure 12:
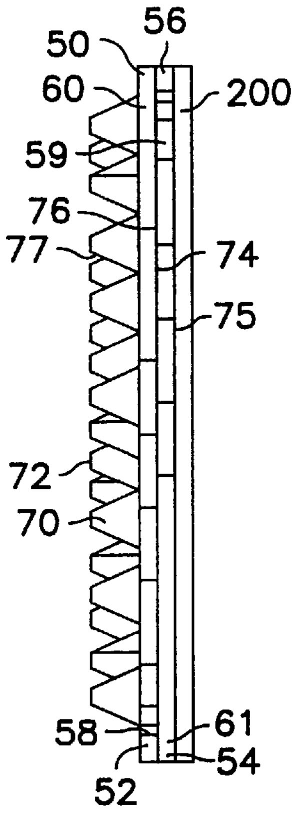
FIG. 12 is a right side elevational view of the alternative reflector assembly including the third disc.
Figure 13:
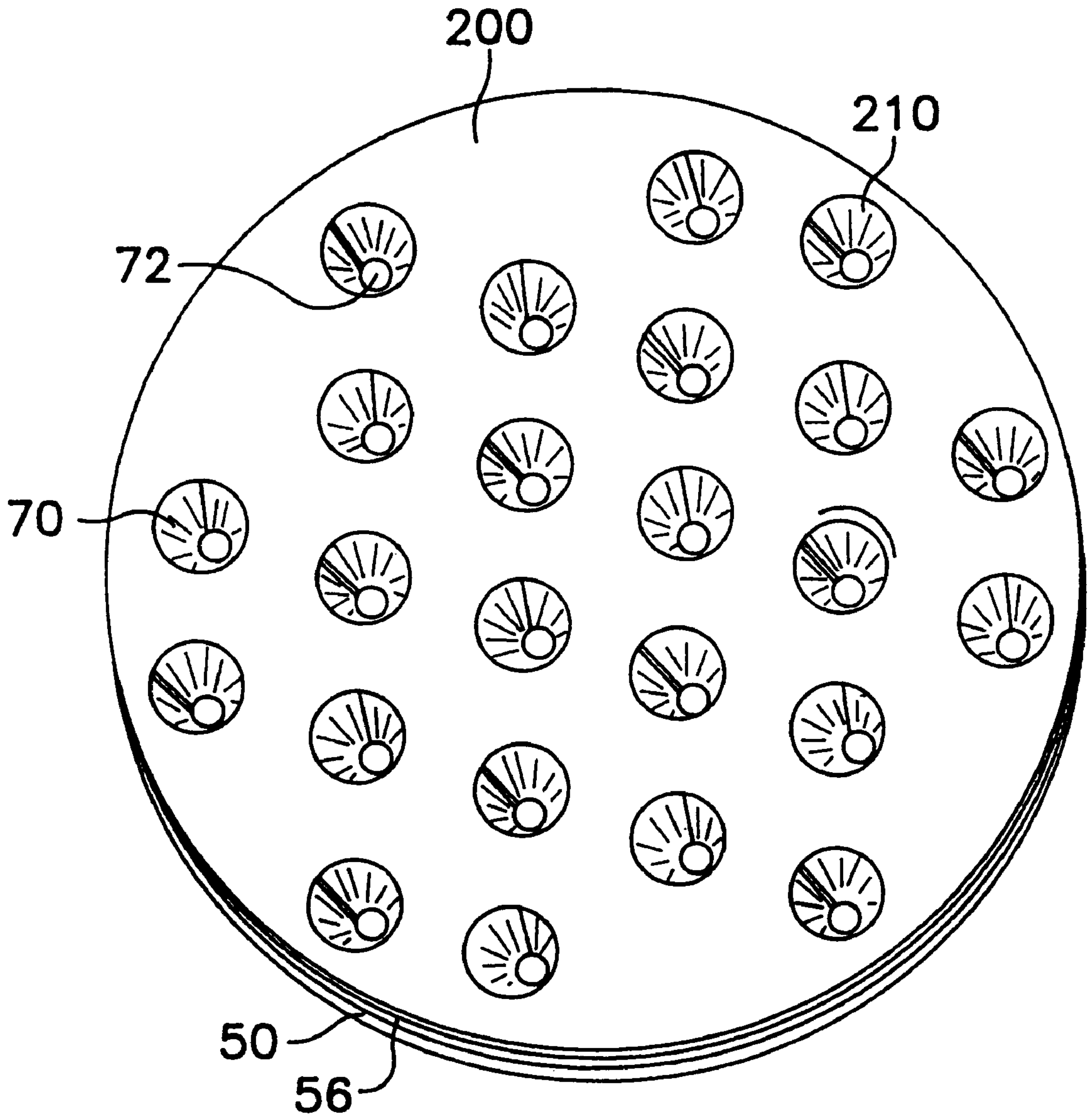
FIG. 13 is a rear perspective view of the alternative reflector assembly including the third disc.

In an alternative embodiment as seen in FIGS. 11, 12, and 13, a third disc 200 may be sandwiched on top of the nested disc 62. This may be desirable in applications requiring a smooth surface facing the reflector 43. The third aluminum disc 200 is placed over the back side 116 of the joined disc 62; thus the distinct regions 112 on the back side 116 of the joined disc 62 are hidden. This third disc 200 is stamped with a plurality of circular holes 210 which align with the circular holes 82 in the joined disc 62. When the third disc 200 is placed on the back side 116 of the joined disc 62, the light from the LEDs 150 passes through both the circular holes 82 in the joined disc 62 and the circular holes 210 in the third disc 200 and towards the lens 158. Providing a smooth surface on the joined disc 62 may be most desirable when a clear lens is used.

The above descriptions are those of preferred embodiments of the invention. Various changes and alterations can be made without departing from the spirit and broader aspects of the invention as defined in the appended claims which are to be interpreted in accordance with the principles of patent law including the doctrine of equivalence.

The embodiments of the invention in which an exclusive property or privilege is claimed are defined as follows:

1. A light reflector comprising:

a first disc and a second disc, said first disc including a plurality of first partial protrusions extending from a front side of said first disc, each of said first partial protrusions stamped from said first disc to form a first aperture, said second disc including a plurality of second partial protrusions extending from a front side of said second disc, each of said second partial protrusions stamped from said second disc to form a second aperture, said first disc and said second disc nesting to form the light reflector, each of said first apertures being aligned with one of said second partial protrusions, each of said second partial protrusions extending through one of said first apertures, each pair of said first and second partial protrusions at each pair of aligned apertures cooperating to form a mini-reflector.

* * * * *